United States Patent [19]
Ozkan

[11] Patent Number: 5,488,641
[45] Date of Patent: Jan. 30, 1996

[54] DIGITAL PHASE-LOCKED LOOP CIRCUIT

[75] Inventor: Oguz Ozkan, Brampton, Canada

[73] Assignee: Northern Telecom Limited, Montreal, Canada

[21] Appl. No.: 405,171

[22] Filed: Feb. 9, 1995

Related U.S. Application Data

[63] Continuation of Ser. No. 988,536, Dec. 10, 1992, abandoned.

[51] Int. Cl.$^6$ ..................................................... H03D 3/24
[52] U.S. Cl. ..................... 375/374; 375/376; 370/108; 327/150
[58] Field of Search ........................... 375/376, 375, 375/374, 373, 371, 354; 327/141, 142, 144, 146–153, 155–163, 1–3, 39, 40; 331/1 R, 18, 25, DIG. 2; 370/53, 105.3, 108

[56] References Cited

U.S. PATENT DOCUMENTS

| | | |
|---|---|---|
| 3,931,585 | 1/1976 | Barker et al. . |
| 4,519,071 | 5/1985 | Miller . |
| 4,617,679 | 10/1986 | Brooks . |
| 4,724,402 | 2/1988 | Ireland . |
| 5,077,529 | 12/1991 | Ghoshal et al. ........................ 375/120 |
| 5,079,519 | 1/1992 | Ashby et al. ........................... 375/120 |
| 5,218,314 | 6/1993 | Efendovich et al. .................... 375/120 |

Primary Examiner—Stephen Chin
Assistant Examiner—Hai H. Phan
Attorney, Agent, or Firm—F. P. Turpin

[57] ABSTRACT

A digital phase-locked loop circuit includes circuitry for generating substantially periodic recovered clock signals each one corresponding to a discrete amount of delay from a local clock signal. Incremental delay is added or subtracted at each clock generation cycle until the data input signal and the last-generated recovered clock signal are substantially phase-aligned. The circuit includes delay measurement circuitry for dynamically measuring the smallest quantity of delay units required to provide at least a 360 degree phase shift of the local clock signal. The circuitry for generating the recovered clock signals is then constrained to generate clock signals having a maximum delay corresponding to the last-measured quantity of delay.

20 Claims, 5 Drawing Sheets

DIGITAL PHASE-LOCKED LOOP CIRCUIT

This is a Continuation of Application Ser. No. 07/988,536, filed Dec. 10, 1992 which is now abandoned.

FIELD OF THE INVENTION

The invention relates generally to synchronization circuits and more specifically to an improved digital phase-locked loop circuit for synchronizing a local clock signal to a received input data signal.

BACKGROUND OF THE INVENTION

Phase-locked loop (PLL) circuits have been used for many years for the purpose of generating a signal in a preferred phase relationship with another signal. Prior art phase-locked loop circuits are exemplified in U.S. Pat. No. 4,724,402 issued Feb. 9, 1988 in the name of Karl Ireland, and in U.S. Pat. No. 3,931,585 issued May 31, 1988 in the name of Barker et al. granted Jan. 6, 1976. In telephony systems, it is often required to have a local clock follow a primary master clock in a preferred phase relationship provided by a remote location. For example, U.S. Pat. No. 4,519,071 issued May 21, 1985 to Miller, describes a phase-locked loop circuit that permits clock signals which are generated in a line switch module to be in phase synchronism with any one of a number of PCM lines.

PLL circuits are often used in clock circuits in the receivers of digital signals for the purpose of generating a local clock signal phase-aligned with an incoming reference signal. The PLL circuit within the receiver can adjust its local clock signal frequency to a multiple of the frequency of the reference signal provided by a transmitting device and consequently aligns these two signals together. Once this phase alignment has occurred, the phase relationship between the reference signal and the local clock signal is referred to as being locked and the receiver may receive synchronous data sent by the transmitter.

U.S. Pat. No. 4,617,679 issued Oct. 14, 1986 to Phillip L. Brooks, describes a digital PLL circuit wherein one of a plurality of delayed signals generated from a single source is selected as an output clock signal which is synchronized to an incoming data stream. Brooks' circuit replaces a conventional analog voltage controlled oscillator with a digital multiplexed delay line. A digital phase comparator provides an up/down counter with a signal for incrementing or decrementing its count if the received reshaped pulse is located within the first or last 30 percent of the data period. A multiplexer is responsive to a count of the up/down counter to select a tap from the delay line to generate the output clock signal. The delay line provides a predetermined delay with men taps each of which provides a fixed delay increment of 36 degrees. Suitable performance of the circuit depends upon a 360 degree phase shift after cycling through all ten taps. However, if the ambient temperature, component deterioration or other reasons cause the total delay to be more or less than 360 degrees, the duration of the delay between the tenth and the first tap would be a longer, or shorter mime interval than the duration of delay between any other pair of successive taps thereby causing undesirable jitter.

In high speed clock circuits it is not uncommon for process variation and temperature variation to significantly affect the duration of delays. These unwanted variations may significantly alter the number of delay increments required to obtain a 360 degree phase shift. However, it is desirable to have an equal delay between adjacent delay taps and approximately the same equal delay after cycling from the last selected tap back to the first tap in order to minimize jitter due to a discontinuity. It is also desirable to provide many delay taps with each delay representing a very short interval of time.

A cost effective delay line may be provided by a monolithic high speed integrated circuit having a serially connected chain of inverters and taps provided at the output terminal of every second inverter. However, due to process and temperature variations within the substrate of such an integrated circuit, the duration of the delay through an inverter pair may vary by as much as 100 percent. For example, an inverter having an expected delay of 0.3 nS may in fact have a delay of 0.6 nS.

SUMMARY OF THE INVENTION

It is an object of the invention to provide a relatively stable phase-locked loop timing circuit which allows for some process and temperature variation within the circuit while minimizing jitter associated with phase adjustment discontinuity. The circuit provides means for making allowance in variation of delay by dynamically quantizing the number of delay elements required for attaining approximately a 360 degree phase shift of a reference signal and constraining the circuit to operate within that limitation.

In accordance with one aspect of the invention there is provided a phase-locked loop circuit comprising a first circuit for generating recovered clock signals each one corresponding to a discrete amount of delay of a local clock signal, the first circuit including a delay line having a predetermined number of delay units n and corresponding taps distributed at substantially equal increments along its length, the total delay duration of the delay line being substantially larger than a period of the local clock signal, means for comparing the phase of an input data signal with the last generated recovered clock signal and for generating a difference signal when a phase difference exists between its input signals, and means responsive to the difference signal for selecting an adjacent tap for the generation of a subsequent recovered clock signal, the selecting means including a first multiplexer connected to the taps of the delay line to provide a delayed signal from a selected tap and a first counter for providing tap select control signals to the first multiplexer; means for measuring the smallest quantity of delay units required to provide at least a 360 degree phase shift of the local clock signal; and means for limiting the maximum count of the first counter to a value corresponding to the measured quantity of delay units.

In accordance with another aspect of the invention there is provided a method of generating recovered clock signals in a phase-locked loop circuit having a first circuit for generating recovered clock signals each one corresponding to a discrete amount of delay of a local clock signal, the first circuit including a delay line having a predetermined number of delay units n and corresponding taps distributed at substantially equal increments along its length, the total delay duration of the delay line being substantially larger than a period of the local clock signal, means for comparing the phase of an input data signal with the last-generated recovered clock signal and for generating a difference signal, and means responsive to the difference signal for selecting an adjacent tap for the generation of a subsequent recovered clock signal, the selecting means including a multiplexer connected to the taps of the delay line to provide a delayed signal from a selected tap and a first counter for providing tap select control signals to the multiplexer, the method comprising the steps of measuring the smallest quantity of delay units required to provide at least a 360 degree phase shift of the local clock signal; and limiting the maximum count of the first counter to a value corresponding to the measured quantity of delay units.

BRIEF DESCRIPTION OF THE DRAWINGS

An embodiment of the invention will now be described in conjunction with the drawings in which.

DETAILED DESCRIPTION

Figure 1:
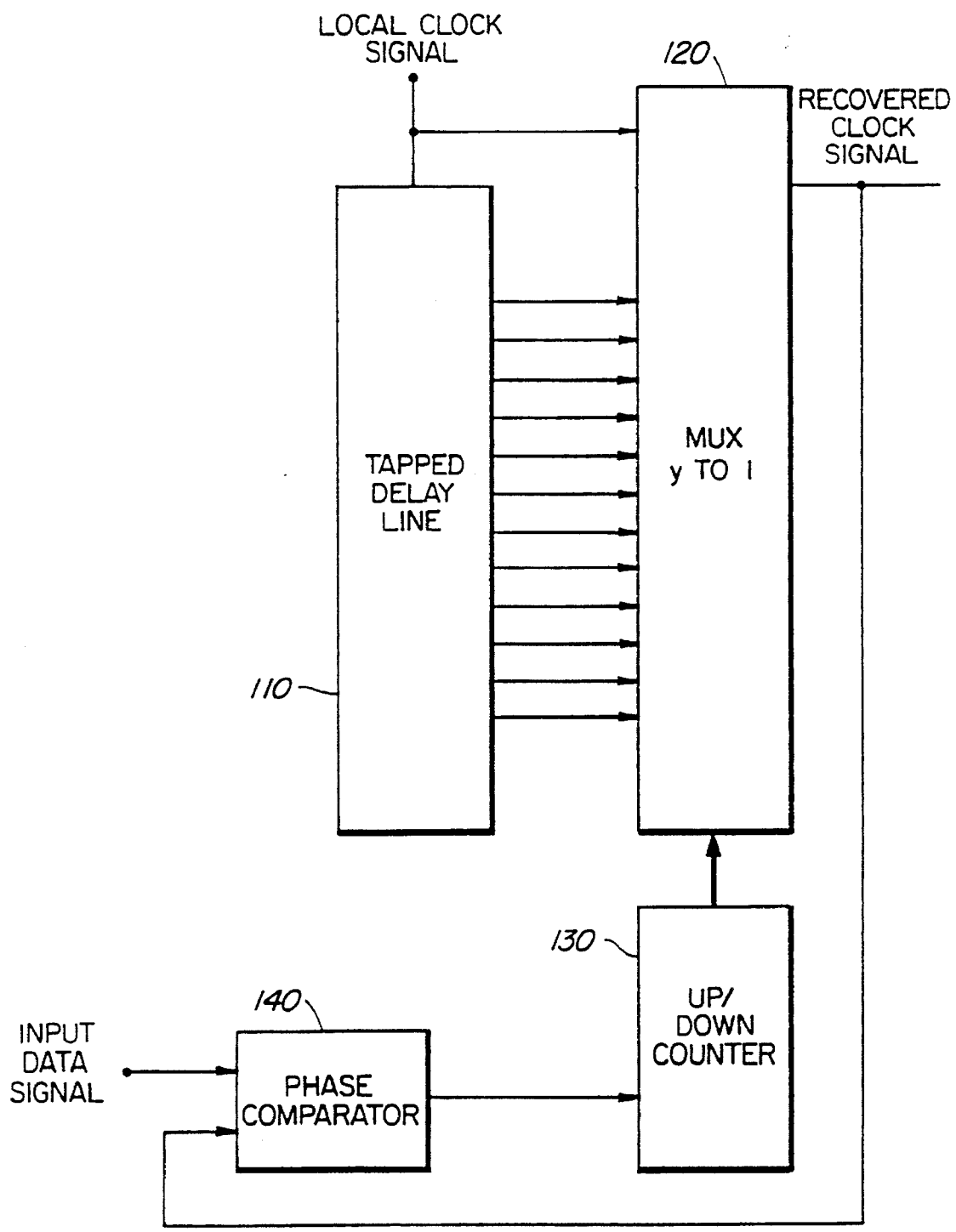
FIG. 1 is a block diagram of a conventional prior art digital phase-locked loop circuit.

Referring to FIG. 1, a conventional prior art digital PLL circuit is shown as having a tapped delay line 110 responsive to a local clock signal having a frequency $f_1$ for generating y-1 delayed signals each having a frequency $f_1$. A y to 1 multiplexer 120 is responsive to control signals generated by a counter 130 to select one of the delayed signals to provide a recovered clock signal. A phase comparator 140 is responsive to the recovered clock signal and an input data signal for comparing the phase relationship between the two signals and for providing the counter 130 with a difference signal corresponding to the phase relationship between the recovered clock signal and the input data signal.

In operation, the value stored in the counter 130 is incremented or decremented in response to the difference signal and hence to the phase relationship between the recovered clock signal and the input data signal. The control signals presented to the multiplexer by the counter 130 are generated from the counted value stored in the counter 130; as it is incremented, a different delayed signal of the tapped delay line 110 is selected via the multiplexer 120 as a new recovered clock signal. For the circuit to be free of jitter, cycling through each count of the counter from 0 to the maximum count and back to 0 should ideally provide a 360 degree phase shift of the local clock signal. However, because of timing variations due to factors such as varying ambient temperature and component variation due to ageing and deterioration, the total phase shift range may vary significantly over time.

Figure 2:
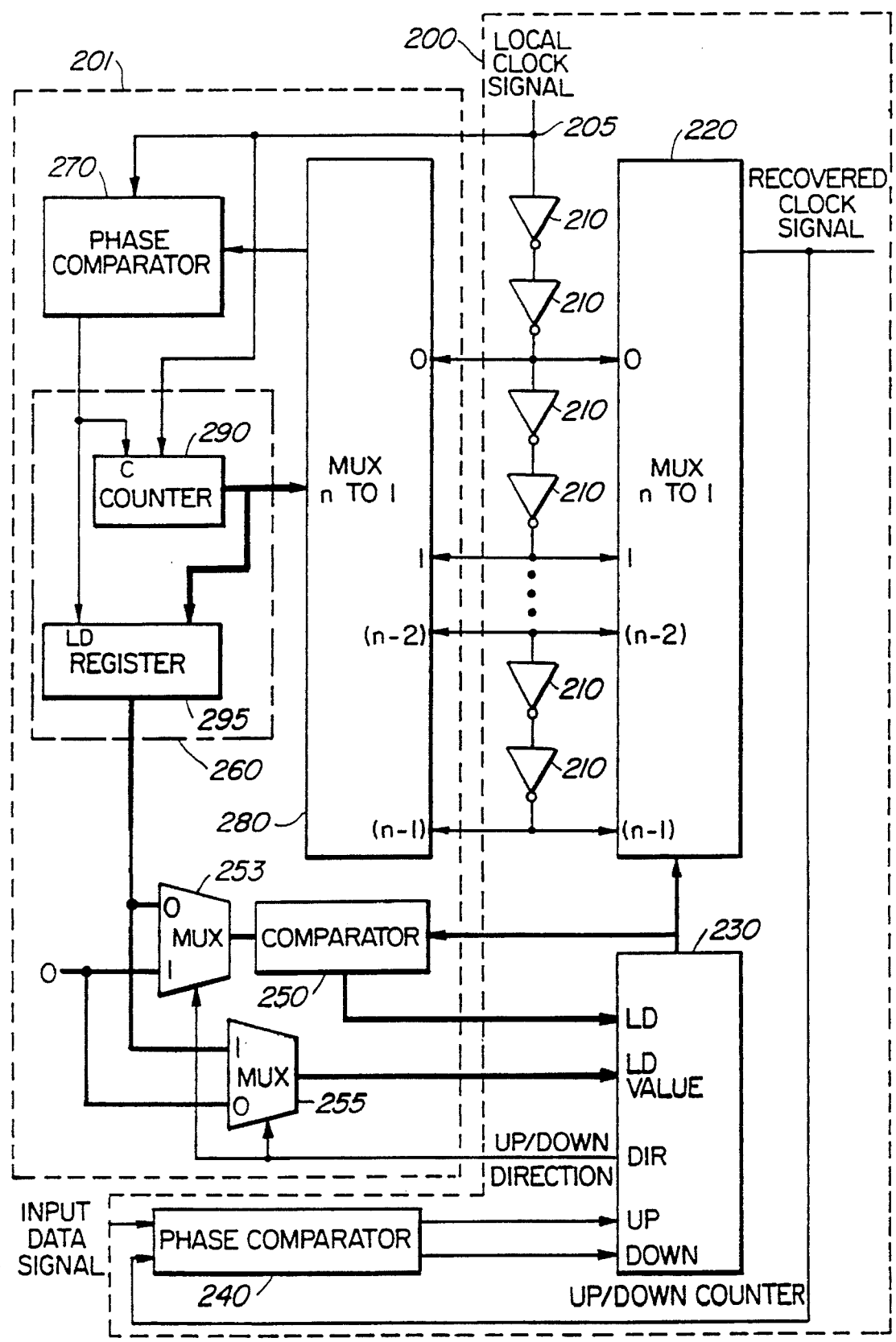
FIG. 2 is a block diagram of a digital phase-locked loop circuit in accordance with the invention.

FIG. 2 comprises functional circuit blocks 200 and 201. The circuit 200 includes phase alignment circuitry comprising a delay line comprised of a chain of delay elements in the form of 2n inverters 210 serially connected to create n taps each providing a signal exhibiting one unit of delay. The inverters 210 may conveniently be a high speed integrated circuit. One end of the chain of 2n inverters 210 is coupled to a terminal 205 for receiving a local clock signal having a frequency $f_0$. Each input line of an n to 1 multiplexer 220 is coupled to a respective tap of the delay line to receive a respective delayed signal. Each delay line illustrated in the drawings shows a pair of inverters before or after tap 0; these insure at least a one-delay separation between a selected tap and tap 0. An up/down counter 230 is coupled to the multiplexer 220 to provide select control signals for selecting one of the n delayed signals as a recovered clock signal. A phase comparator 240 compares the phase relationship between the recovered clock signal and an input data signal and generates a difference signal fed to the up/down counter 230 which changes its counted value in response to the difference signal. The frequency of the recovered clock signal over time may be higher or lower in frequency than $f_0$. For example, whenever the counter 230 is incremented or decremented, a different delayed signal is selected by the multiplexer and the recovered clock signal has a correspondingly lower or higher frequency.

The circuit block 201 comprises delay measurement circuitry for dynamically measuring the quantity of delay units m required to provide at least a 360 degree phase shift of the local clock signal. The circuit 201 includes an n to 1 multiplexer 280 coupled to the n taps of the delay line, a phase comparator 270 coupled to the multiplexer 280 for comparing the phase relationship between the local clock signal and a selected output signal of the n to 1 multiplexer 280. The phase comparator generates a compare signal when the phase relationship between the local clock signal and a selected delayed signal just exceeds 360 degrees.

A phase register circuit 260 comprises a register 295 and a counter 290 for counting periods of the local clock signal. The register circuit 295 is responsive to the compare signal generated by the comparator 270 to load the value of the counter 290. At that point in time, the count of the counter 290 corresponds to the value m. The up/down counter 230 generates a direction control signal DIR which indicates that the counter 230 is either up or down counting. When the signal indicates that the counter is up-counting, a multiplexer 253 is enabled to couple the register 295 with a comparator 250 which compares the value stored in the register 295 with the counted value of the up/down counter 230. On a match, a clear signal is asserted by loading a zero value into the up/down counter 230 so that the next select control signal to the multiplexer 220 will correspond to the first tap of the delay line. Alternatively, when the counter 230 is in a down-counting mode, the comparator 250 compares the value zero with the value generated by the counter 230 and, on a match, the value m stored in the load register 295 is loaded into the up/down counter 230 via the multiplexer 255.

In operation, the circuit of block 200 continuously generates recovered clock signals as described above; the counter 290 counts periods of the local clock signal and provides the multiplexer 280 with counted values, each one used as a signal for selecting one of n multiplexed delayed signals. The phase comparator 270 is responsive to each selected delayed signal from the multiplexer 280 and to the local clock signal for comparing the phase relationship therebetween. When the phase comparator output signal indicates that the last-selected delay signal corresponds to at least a 360 degree phase shift relative to the local clock signal, the value of the counter is captured in register 295 and the counter 290 is reset. The value or count stored in register 295 then corresponds to the value m. As described above, the counter 230 thus cycles to provide select signals corresponding from tap 1 to tap m. However, the up/down counter is capable of counting up or counting down. If the phase comparator 240 determines that the input data signal is of a lower frequency than the recovered clock signal, the phase comparator 240 asserts an up control signal and the counter 230 counts in an up-counting mode to decrease the frequency of the recovered clock signal relative to the input data signal. Conversely, when the data signal is of a higher frequency than the reference signal, the phase comparator 240 asserts a down control signal and the counter 230 counts in a down-counting mode to increase the relative frequency of the recovered clock signal.

The value stored in the phase register circuit 260 is continually updated so that if the number of delay units required to form a delay equal to one period of the local clock signal changes due to a variation in temperature, the value m will be adjusted accordingly to accommodate the change in the duration of the delay. To allow for large temperature, voltage and component variations which may affect the circuit, n should preferably be about twice the expected value of m at conventional ambient temperature. In a practical embodiment of the circuit, satisfactory operation was obtained with a delay line having 64 taps corresponding to a total phase shift of about 720 degrees of the local clock signal.

The rate of incrementation by counter 290 is of course arbitrary; it could be incremented once for any predetermined number of cycles of the local clock signal provided that the variation in supply voltage and temperature can be adequately tracked.

When the frequency relationship between the local clock signal and the input data signal is known, the circuit shown in FIG. 2 can be replaced with a simpler circuit using either an up-counter or a down-counter in place of the up/down counter 230. For example, if the frequency of the local clock signal is chosen to be higher than the highest expected frequency embedded in the input data signal, an up-counter may be used to count upward from zero. As the count of the counter increases, a more delayed signal is selected as a recovered clock signal thereby essentially slowing down the frequency of the recovered clock signal relative to the frequency of the input data signal. Conversely, if the frequency of the local clock signal is chosen to be slower than that of the input data signal, a down counter may be used to select less delayed signals on each down count.

Figure 3:
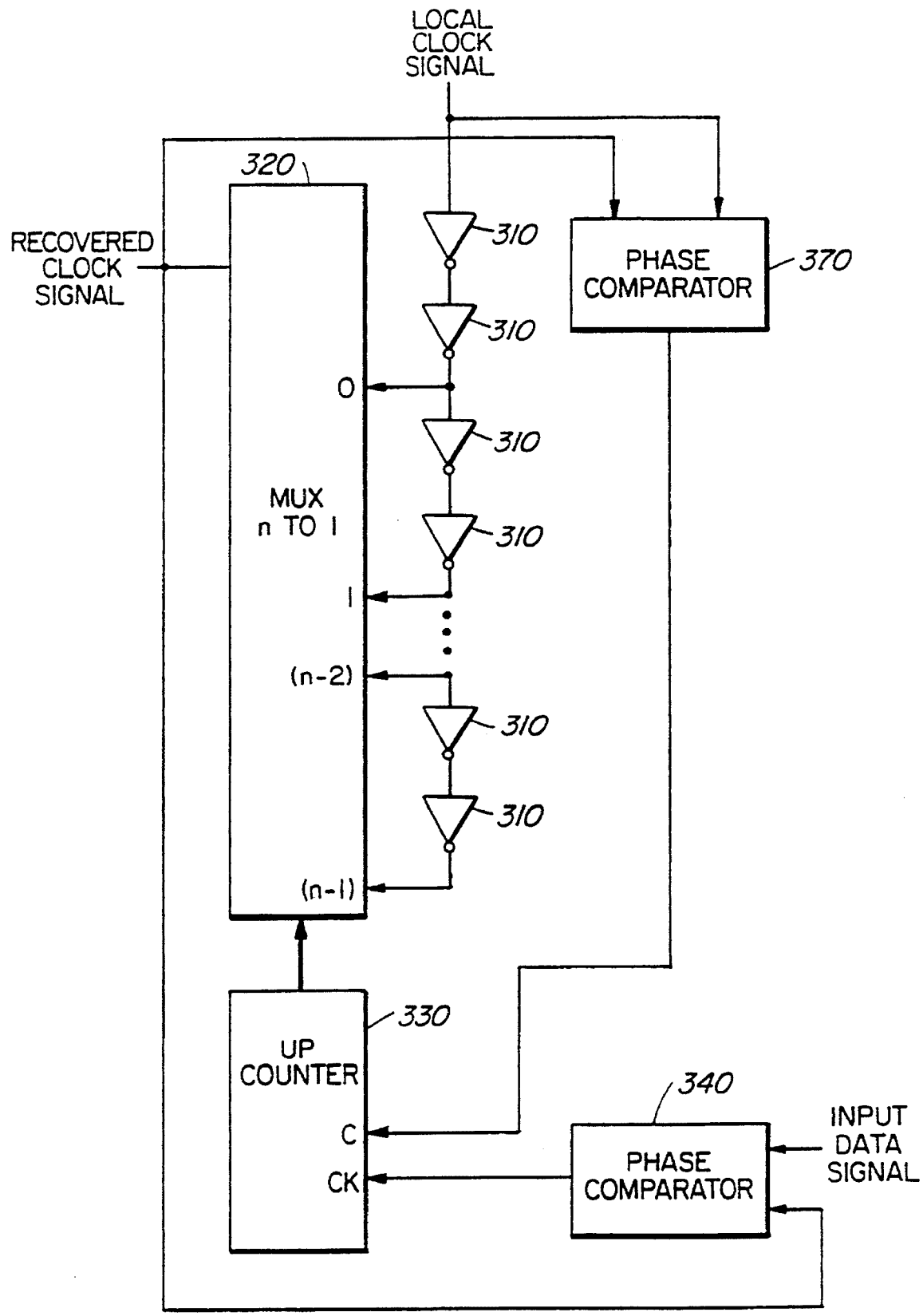
FIG. 3 is a block diagram of a first alternative embodiment of a digital phase locked-loop circuit in accordance with the invention.

The PLL circuit of FIG. 3 illustrates a circuit in which the local clock signal is chosen to have a higher frequency than the highest expected frequency embedded in the input data signal. Phase comparators 370, 340 and multiplexer 320 each operate in substantially the same manner as phase comparators 270, 240 and multiplexer 220 of FIG. 2. The up-counter 330 increments its count in response to a difference signal generated by the phase comparator 340 which compares the phase relationship between the incoming data signal with the recovered clock signal; this causes the multiplexer to select taps of the delay line in an increasing sequence from 0 towards n−1. The effect is to lower the effective frequency of the recovered clock signal unit until it is just slower than that of the input data signal. At that point, the phase comparator 370 detects that the phase of the recovered clock has just passed 360 degrees relative to the local clock signal and allows the generation of a clear signal to reset the counter 330. The phase comparator 370 uses an edge of one input signal to detect a passing edge of the other input signal; phase alignment actually occurs just before it is detected by the comparator 370. The phase rotation of the recovered clock signal is thus slightly more than 360 degrees.

If the frequency of the local clock signal is chosen to be lower than the frequency of the input data signal, a down-counter may be used in place of the up-counter 330. In this case, minor modifications have to be made to the circuit to ensure that the down-counter is loaded with a value corresponding to a maximum count of the counter when the phase difference detected by a counterpart of phase comparator 370 is approximately zero.

Figure 4:
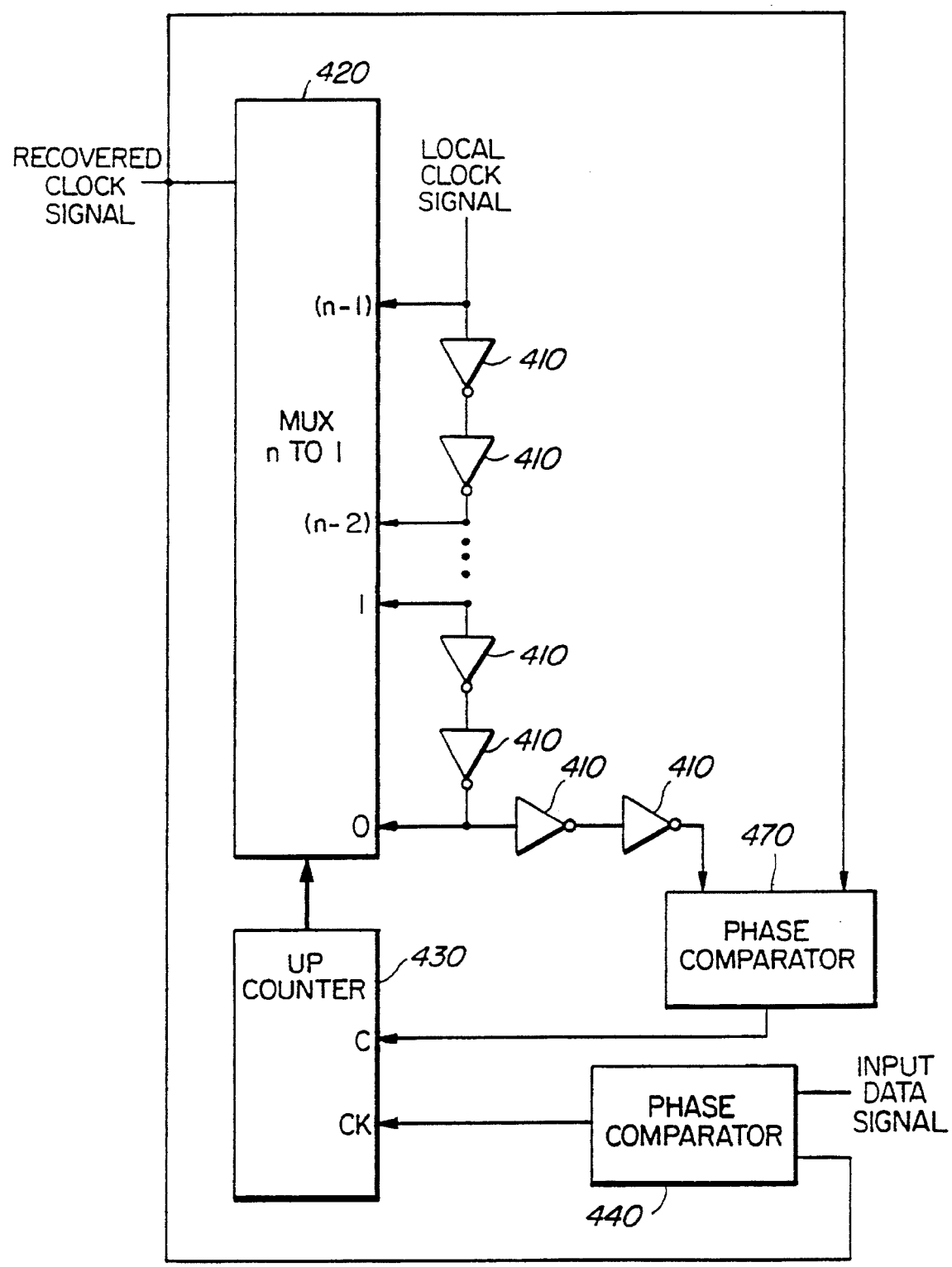
FIG. 4 is a block diagram of a second alternative embodiment of a digital phase locked-loop circuit in accordance with the invention.

Alternatively, the circuit shown in FIG. 4 can be used when the frequency of the local clock signal is lower than the frequency of the input data signal. This circuit uses the same components as that of FIG. 3; however, input signals to a multiplexer 420 from the taps of a delay line comprising delay units 410 are configured differently. The taps are connected in reverse order to the input signals to the multiplexer 320 of FIG. 3. The local clock signal is provided as an input signal to tap (n−1) of the multiplexer 420, a first delayed signal is provided as an input signal to tap (n−2) and so on, the second to last delay unit being connected to tap 0 of the multiplexer 420. A phase comparator 470 is responsive to the recovered clock signal and to the local clock signal delayed through all the delay units. As the count of counter 430 increases, the tap selection progresses from 0 towards n−1. The edge of the recovered clock signal therefore moves progressively to the left on a time scale thus effectively increasing the frequency of the recovered clock signal relative to the input data signal until its frequency is slightly higher. At this point, the phase comparator 470 generates a compare signal that may be used to reset the counter 430.

Figure 5:
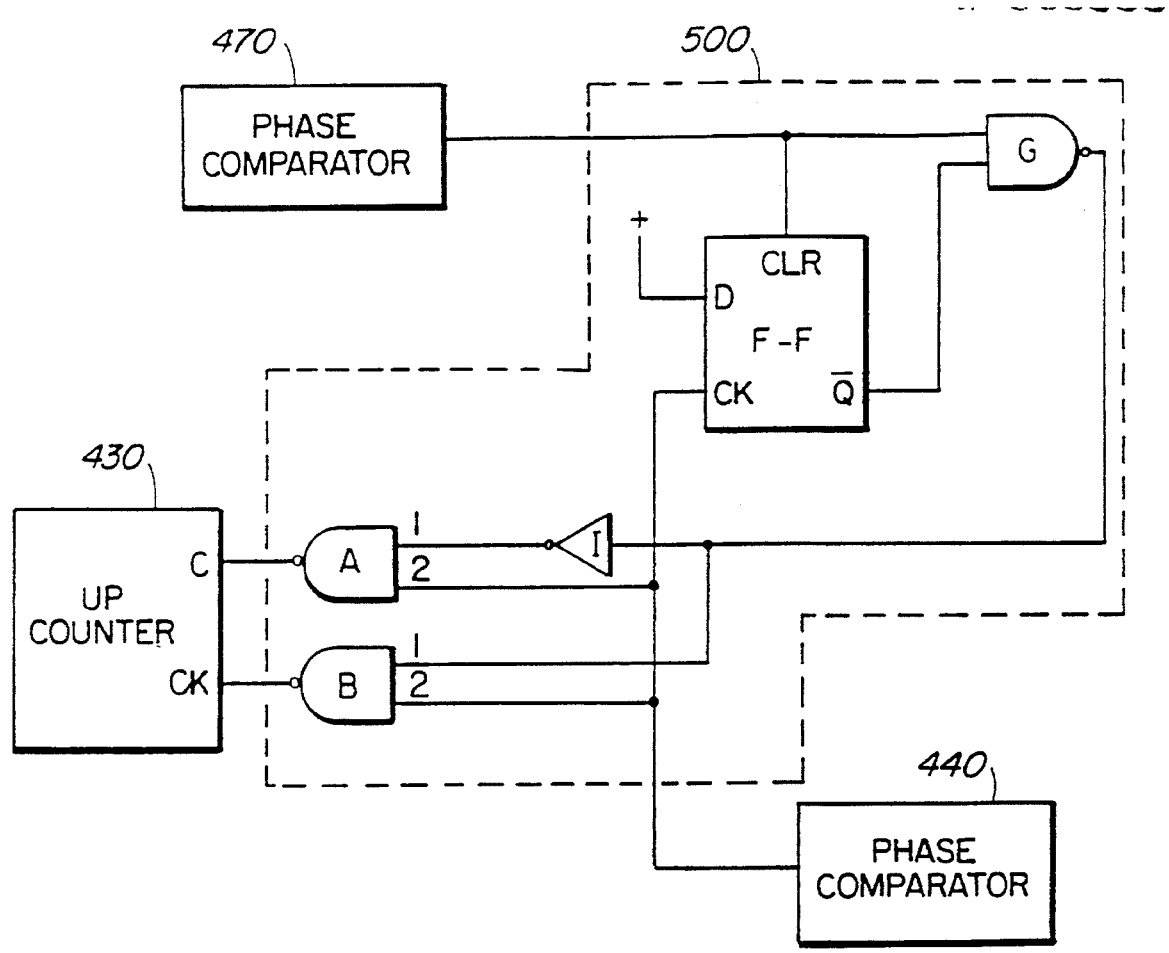
FIG. 5 is a logic diagram of a circuit useful in the implementation of the circuit of FIG. 3 or 4.

FIG. 5 illustrates a circuit 500 useful in the minimization of any phase discontinuity associated with the resetting of the counter 430 by using the compare signal to arm a steering circuit which causes the counter to be reset only on the difference signal following the one that was coincident with the compare signal. Such a circuit may be achieved by simply using a flip-flop that is toggled by the compare signal and whose output is used to arm a logic gate to thereby divert the next difference signal to the clear input from the CK input of counter 430. In operation, a compare signal at the output of the comparator 470 prevents the flip-flop F—F from toggling on a coincident difference signal from comparator 440; this causes input 1 of gate A to be high so that the next difference signal from the phase comparator 440 is diverted from the CK input of the counter 430 to its C input thereby resetting it. Subsequent difference signals from the comparator 440 appear at the CK input of counter 430 to increase its count as described above.

What is claimed is:

1. A phase-locked loop circuit comprising:
a first circuit for generating recovered clock signals each one corresponding to a discrete amount of delay of a local clock signal, the first circuit including a delay line having a predetermined number of delay units n and corresponding taps distributed at substantially equal increments along the length of the delay line, the total delay duration of the delay line being substantially larger than a period of the local clock signal, means for comparing the phase of an input data signal with a last-generated recovered clock signal and for generating a difference signal when a phase difference exists between the input data signal and the last-generated recovered clock signal, and means responsive to the difference signal for selecting a tap of the delay line for the generation of a recovered clock signal, the selecting means including a first counter responsive to said difference signal from the comparing means for providing tap select control signals and a first multiplexer responsive to the tap select control signals and connected to the taps of the delay line to provide the recovered clock signal from a tap selected in accordance with the tap select control signals;

means responsive to the local clock signal and to signals from respective taps of the delay line for measuring the smallest quantity of delay units required to provide at least a 360 degree phase shift of the local clock signal and for generating a corresponding output signal; and means responsive to the output signal generated by the measuring means for limiting the first counter to a count corresponding to the measured quantity of delay units.

2. A phase-locked loop circuit as defined in claim 1 wherein the means for measuring comprises:

means responsive to the local clock signal for periodically selecting a delayed signal from the delay line incremented by one delay unit from a previously selected delayed signal and for counting periodically selected delayed signals;

a first comparator for comparing, at every selection, the phase of the selected delayed signal with the phase of the local clock signal and for generating a compare output signal when the comparison indicates that the phase difference between its input signals is at least 360 degrees; and means responsive to the compare output signal for storing a value m corresponding to the number of selections that were required to generate the compare output signal.

3. A phase-locked loop circuit as defined in claim 2 wherein the limiting means comprises a second comparator circuit responsive to a match between the stored value m and a tap select control signal at the output of the first counter to provide a clear signal to the first counter.

4. A phase-locked loop circuit as defined in claim 3 wherein the delayed signal is selected at every local clock signal and wherein the means for periodically selecting the delayed signal comprises a second multiplexer circuit connected to the taps of the delay line and a second counter for counting each pulse of the local clock signal, the second multiplexer circuit being responsive to each count of the second counter for incrementally selecting a different tap at each count.

5. A phase-locked loop circuit as defined in claim 4 wherein n is about twice as large as the expected value of m at ambient temperature.

6. A phase-locked loop circuit comprising:

a first circuit for generating recovered clock signals each one corresponding to a discrete amount of delay of a local clock signal, the first circuit including a delay line having a predetermined number of delay units n and corresponding taps distributed at substantially equal increments along the length of the delay line, the total delay duration of the delay line being substantially larger than a period of the local clock signal, means for comparing the phase of an input data signal with a last-generated recovered clock signal and for generating a difference signal when a phase difference exists between the input data signal and the last-generated recovered clock signal, and means responsive to the difference signal for selecting a tap of the delay line for the generation of a recovered clock signal, the selecting means including a counter responsive to said difference signal from the comparing means for providing tap select control signals and a multiplexer responsive to the tap select control signals and connected to the taps of the delay line to provide the recovered clock signal from a tap selected in accordance with the tap select control signals;

a comparator for monitoring the phase relationship between the local clock signal and recovered clock signals; and for generating an output signal indicative of the phase relationship between the signals at its inputs;

means for measuring the smallest quantity of delay units required to provide at least a 360 degree phase shift between the local clock signal and the recovered clock signal; and means for loading the counter in the selecting means with a value corresponding to the measured quantity of delay units when the output signal of the comparator indicates that the local clock signal and the recovered clock signal are substantially phase aligned.

7. A phase-locked loop circuit comprising:

a first circuit for generating recovered clock signals each one corresponding to a discrete amount of delay of a local clock signal, the first circuit including a delay line having a predetermined number of delay units n and corresponding taps distributed at substantially equal increments along the length of the delay line, the total delay duration of the delay line being substantially larger than a period of the local clock signal, means for comparing the phase of an input data signal with a last-generated recovered clock signal and for generating a difference signal when a phase difference exists between the input data signal and the last-generated recovered clock signal, and means responsive to the difference signal for selecting a tap of the delay line for the generation of a recovered clock signal, the selecting means including a counter responsive to said difference signal from the comparing means for providing tap select control signals and a multiplexer responsive to the tap select control signals and connected to the taps of the delay line to provide the recovered clock signal from a tap selected in accordance with the tap select control signals; and a comparator responsive to the phase relationship between the local clock signal and the recovered clock signal at the output of the multiplexer for generating a clear signal to the counter when the frequency of the recovered clock signal is higher than the frequency of the local clock signal and the difference therebetween corresponds to less than one delay unit.

8. A phase-locked loop circuit as defined in claim 7 wherein the local clock signal has a higher frequency than the highest expected frequency of the input data signal and the delay line further comprises an additional delay unit connected between the source of the local clock signal and the first delay unit of the delay line.

9. A phase-locked loop circuit comprising:

a first circuit for generating recovered clock signals each one corresponding to a discrete amount of delay of a local clock signal, the first circuit including a delay line having a predetermined number of delay units n and corresponding taps distributed at substantially equal increments along the length of the delay line, the total delay duration of the delay-line being substantially larger than a period of the local clock signal, means for comparing the phase of an input data signal with a last-generated recovered clock signal and for generating a difference signal when a phase difference exists between the input data signal and the last-generated recovered clock signal, and means responsive to the difference signal for selecting a tap of the delay line for the generation of a recovered clock signal, the selecting means including a counter responsive to said difference signal from the comparing means for providing tab select control signals and a multiplexer responsive to the tap select control signals and connected to the taps of the delay line to provide the recovered clock signal from a tap selected in accordance with the tap select control signal, the local clock signal having a lower frequency than the frequency of the input data signal, the counter and the multiplexer being arranged to respond to the difference signal by selecting an adjacent tap carrying a local clock signal that is delayed by a lesser amount than that of the signal carried on the previously selected tap; and a phase comparator responsive to the recovered clock signal and a local clock signal for generating a compare signal for resetting the counter when the frequency of the recovered clock signal is lower than that of the local clock signal and the phase difference therebetween corresponds to less than one delay unit.

10. A phase-locked loop circuit as defined in claim 9 and further comprising a control circuit means for delaying the resetting of the counter on the occurrence of the compare signal until the occurrence of a next difference signal following the difference signal that was substantially coincident with the compare signal.

11. A phase-locked loop circuit as defined in claim 10 wherein the control circuit comprises a pair of steering gates and a memory element responsive to the compare signal for diverting the next difference signal from the clock input to the clear input of the counter.

12. A phase-locked loop circuit as defined in claim 11 wherein the delay line further comprises a delay unit connected between the longest-delay tap of the delay line and an input of the phase comparator.

13. A method of generating recovered clock signals in a phase-locked loop circuit having a first circuit for generating recovered clock signals each one corresponding to a discrete amount of delay of a local clock signal, the first circuit including a delay line having a predetermined number of delay units n and corresponding taps distributed at substantially equal increments along the length of the delay line, the total delay duration of the delay line being substantially larger than a period of the local clock signal, means for comparing the phase of an input data signal with a last-generated recovered clock signal and for generating a difference signal, and means responsive to the difference signal for selecting a tap of the delay line for the generation of a recovered clock signal, the selecting means including a counter responsive to said difference signal from the comparing means for providing tap select control signals and a multiplexer responsive to the tap select control signals and connected to the taps of the delay line to generate the recovered clock signal from a tap selected in accordance with the tap select control signals, the method comprising the steps of:

measuring the smallest quantity of delay units required to provide at least a 360 degree phase shift of the local clock signal; and limiting the maximum count of the first counter to a value corresponding to the measured quantity of delay units.

14. A method as defined in claim 13 wherein the measuring step comprises the steps of:

periodically selecting a delayed signal incremented from a previously selected delayed signal in response to the local clock signal; and at every selection, comparing the phase of the selected delayed signal with the phase of the local clock signal and if the comparison indicates that the phase difference between the local clock signal and the delay signal is at least 360 degrees, storing a value m corresponding to the number of selections that were required to reach the comparison.

15. A method as defined in claim 14, wherein the limiting step comprises the step of resetting the first counter upon a match between the stored value m and a tap select control signal at the output of the first counter.

16. A method as defined in claim 15 wherein the periodic selection comprises the steps of counting each pulse of the local clock signal and incrementally accessing a different tap of the delay line on each count.

17. A method as defined in claim 16 wherein n is about twice the expected value of m at ambient temperature.

18. A method of generating recovered clock signals in a phase-locked loop circuit having a first circuit for generating recovered clock signals each one corresponding to a discrete amount of delay of a local clock signal, the first circuit including a delay line having a predetermined number of delay units n and corresponding taps distributed at substantially equal increments along the length of the delay line, the total delay duration of the delay line being substantially larger than a period of the local clock signal, means for comparing the phase of an input data signal with a last-generated recovered clock signal and for generating a difference signal when a phase difference exists between the input data signal and the last-generated recovered clock signal, and means responsive to the difference signal for selecting a different tap of the delay line for the generation of a recovered clock signal, the selecting means including a counter responsive to said difference signal from the comparing means for providing tap select control signals and a multiplexer responsive to the tap select control signals and connected to the taps of the delay line to provide the recovered clock signal from a tap selected in accordance with the tap select control signals, the method comprising the steps of:

comparing the phase relationship between the local clock signal and the recovered clock signal and generating an output signal indicative of the phase relationship therebetween;

measuring the smallest quantity of delay units required to provide at least a 360 degree phase shift between the local clock signal and the recovered clock signal; and loading the counter in the selecting means with a value corresponding to the measured quantity of delay units when the output signal indicates that the local clock signal and the recovered clock signal are substantially phase-aligned.

19. A method of generating recovered clock signals in a phase-locked loop circuit having a first circuit for generating recovered clock signals each one corresponding to a discrete amount of delay of a local clock signal, the first circuit including a delay line having a predetermined number of delay units n and corresponding taps distributed at substantially equal increments along the length of the delay line, the total delay duration of the delay line being substantially larger than a period of the local clock signal, means for comparing the phase of an input data signal with a last-generated recovered clock signal and for generating a difference signal when a phase difference exists between the input data signal and the last-generated recovered clock signal, and means responsive to the difference signal for selecting a different tap of the delay line for the generation of a recovered clock signal, the selecting means including a counter responsive to said difference signal from the comparing means for providing tap select control signals and a multiplexer responsive to the tap select control signals and connected to the taps of the delay line to provide the recovered clock signal from a tap selected in accordance with the tap select control signals, the method comprising the steps of:

comparing the phase relationship between the local clock signal and the recovered clock signal;

resetting the counter in the selecting means on the occurrence of a compare signal generated when the phase difference between the local clock signal and the recovered clock signal is zero or greater but less than the duration of one delay unit.

20. A method of generating recovered clock signals as defined in claim 19 and comprising the further step of delaying the resetting of the counter on the occurrence of the compare signal until the occurrence of a next difference signal following the difference signal that was substantially coincident with the compare signal.

* * * * *